United States Patent [19]

Hiraki et al.

[11] Patent Number: 5,282,018
[45] Date of Patent: Jan. 25, 1994

[54] POWER SEMICONDUCTOR DEVICE HAVING GATE STRUCTURE IN TRENCH

[75] Inventors: Shunichi Hiraki, Nagareyama; Yoshiro Baba, Yokohama, both of Japan

[73] Assignee: Kabushiki Kaisha Toshiba, Kawasaki, Japan

[21] Appl. No.: 53,811

[22] Filed: Apr. 29, 1993

Related U.S. Application Data

[63] Continuation of Ser. No. 814,801, Dec. 31, 1991, abandoned.

[30] Foreign Application Priority Data

Jan. 9, 1991 [JP] Japan ................................. 3-1083

[51] Int. Cl.$^5$ ............................................. H01L 29/78
[52] U.S. Cl. ................................. 257/296; 257/297
[58] Field of Search ............... 357/23.4; 257/296, 297, 257/305

[56] References Cited

U.S. PATENT DOCUMENTS 4,893,160  1/1990  Blanchard .......................... 357/23.4

OTHER PUBLICATIONS

Yilmaz, 'Comparison of Punch-Through & Non Punch-Through . . . ' 8095 IEEE Trans on Ind App, vol IA-22, #3, May/Jun. 1986 pp. 466-469.
Patent Abstracts of Japan, vol. 14, No. 18 (E-873) 3961, Jan. 16, 1990, "Vertical Field-Effect Transistor", 1-260860(A),Masami Sawada, Apr. 11, 1988.
"An Ultra-Low On-Resistance Power MOSFET Fabricated by Using a Fully Self-Aligned Process," Daisuke Ueda, et al., 8093 IEEE Transactions on Electron Devices, ED-34, No. 4, Apr. 1987, pp. 926-930.
"Dielectrically Isolated Intelligent Power Switch," Yu Ohata et al., IEEE Proceedings of the IEEE 1987 Custom Integrated Circuits Conference, May 4-7, 1987, Portland, OR, pp. 443-446.
"Deep-Trench Power MOSFET With an Ron Area Product of 160 mΩ.mm$^2$," Daisuke Ueda, et al., International Electron Devices Meeting, Dec. 7-10, 1986, Los Angeles, CA, pp. 638-641.
"TDMOS—An Ultra-Low On-Resistance Power Transistor," Satyen Mukherjee et al., IEEE Transactions on Electron Devices, vol. 35, No. 12, Dec. 1988, New York, USA, p. 2459, VIB-6.

Primary Examiner—Jerome Jackson
Assistant Examiner—Stephen D. Meier
Attorney, Agent, or Firm—Finnegan, Henderson, Farabow, Garrett & Dunner

[57] ABSTRACT

A power MOS semiconductor device, such as a vertical MOSFET, IGBT, and IPD, includes a body of semiconductor material having a first semiconductor layer having a first conductivity type, a second semiconductor layer having a second conductivity type and formed in the first semiconductor layer to provide a channel, a third semiconductor layer having the first conductivity type and formed in the second semiconductor layer, a trench formed in the first semiconductor layer across the third and second semiconductor layers, a gate insulating film covering a surface of the trench and extending to a surface of the third semiconductor layer, a gate electrode layer provided on the gate insulating film, and a buried layer having the first conductivity type provided in the first semiconductor layer so as to be contiguous to a bottom of the trench.

11 Claims, 4 Drawing Sheets

POWER SEMICONDUCTOR DEVICE HAVING GATE STRUCTURE IN TRENCH

This application is a continuation of application Ser. No. 07/814,801 filed Dec. 31, 1991, now abandoned.

BACKGROUND OF THE INVENTION

1. Field of the Invention

The present invention relates to a semiconductor device having a gate structure in a trench.

2. Description of the Related Art

As a conventional power MOSFET, a DMOS (Double diffusion MOS) structure has been generally used. However, such a structure has the following problems when increasing the integration density by applying a fine pattern structure thereto.

(1) A diffusion length of a lateral direction for forming a base region is limited to a pitch of design layout.

(2) A parasitic JFET (Junction FET) formed between contiguous base regions narrows a path through which a current vertically flows, thereby to increase a resistance component of a buffer layer.

The tendencies of the problems (1) and (2) are enhanced when the design pitch is set to be small. As a result, since an optimum value is present in the layout, a decrease in on-resistance may be limited even if the integration density is increased. However, when the area of an element is increased to decrease the on-resistance, a production cost may be increased, and problems such as an unstable operation of the element or parasitic oscillation caused by parallel connection may be caused.

For this reason, a MOSFET having a gate formed in a trench, a source formed above the gate, and a substrate used as a drain has been developed. In this MOSFET using the trench, the above two drawbacks can be eliminated to improve the integration density and the decrease in the on-resistance.

In the MOSFET having the gate formed in the trench, the on-resistance can be decreased by increasing the depth of the trench. However, when the depth of the trench is increased, a breakdown voltage between the bottom of the trench and the drain may be lowered.

SUMMARY OF THE INVENTION

It is an object of the present invention to provide a power MOS semiconductor device having a low on-resistance and a high breakdown voltage.

It is another object of the present invention to provide a power MOS semiconductor device capable of integrating other semiconductor elements.

According to an aspect of the present invention, a power MOS semiconductor device is provided such as a vertical power MOSFET, IGBT, and IPD, which comprises a body of semiconductor material including a first semiconductor layer having a first conductivity type, a second semiconductor layer having a second conductivity type and formed in the first semiconductor layer to provide a channel, a third semiconductor layer having the first conductivity type and formed in the second semiconductor layer, a trench formed in the first semiconductor layer across the third and second semiconductor layers, a buried layer having the first conductivity type and provided in the first semiconductor layer so as to be contiguous to a bottom of the trench, a gate insulating film covering a surface of the trench and extending to a surface of the third semiconductor layer, and a gate electrode layer provided on the gate insulating film.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

Embodiments of the present invention will be described below with reference to the accompanying drawings.

Figure 1:
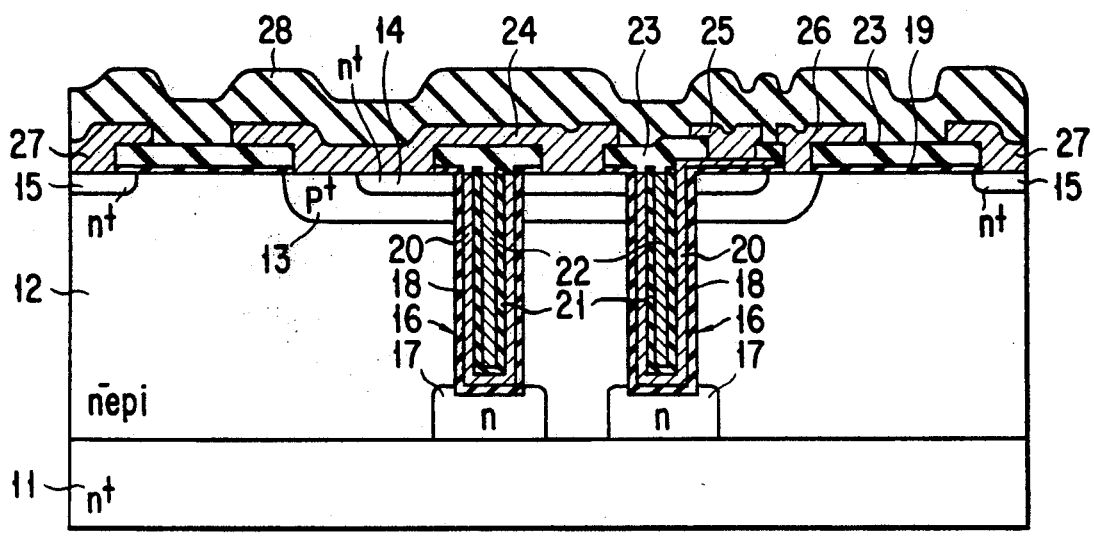
FIG. 1 is a side sectional view showing a power MOSFET according to a first embodiment of the present invention.

FIG. 1 is a power MOSFET according to the first embodiment of the present invention. In FIG. 1, an n+-type silicon substrate 11 serving as a drain has an impurity concentration of $1 \times 10^{18}$ cm$^{-3}$ or more. An epitaxial layer 12 of n−-type silicon is formed on the n+-type silicon substrate 11. The epitaxial layer 12 has a thickness of about 10 μm and an impurity concentration of $1 \times 10^{15}$ cm$^{-3}$. A channel region 13 of a p+-type impurity region is formed in the epitaxial layer 12, and a source region 14 of an n+-type impurity region is formed in the channel region 13. The channel region 13 has a diffusion thickness of 2.0 μm and an impurity concentration of $1 \times 10^{18}$ cm$^{-3}$, and the source region 14 has a diffusion thickness of 0.5 μm and an impurity concentration of $1 \times 10^{20}$ cm$^{-3}$. When the source region 14 is provided, a channel stopper 15 for preventing a leak current from a junction edge is simultaneously formed. A trench 16 is formed in the epitaxial layer 12 across the source region 14 and the channel region 13, and an n-type buried layer 17 is provided between the bottom of the trench and the substrate 11. The buried layer 17 has a thickness of 3 to 4 μm and an impurity concentration of $5 \times 10^{15}$ cm$^{-3}$ to $1 \times 10^{17}$ cm$^{-3}$. The buried layer 17 is formed by implanting impurity ions into the epitaxial layer 12 through the trench 16.

A gate oxide film (SiO$_2$) 18 is provided on the inner surface of the trench 16 to have a thickness of 500 to 1,000 Å. The gate oxide film 18 is simultaneously formed when a thermal oxide film 19 of a field region is provided on the epitaxial layer 12. A gate electrode layer 20 of polysilicon is formed inside the gate oxide film 18 to a thickness of 4,000 Å. A polysilicon oxide film 21 is provided inside the gate electrode layer 20 to have a thickness of 500 Å. In addition, a buried polysilicon layer 22 is formed inside the polysilicon oxide film 21 to have a thickness of, e.g., 8,000 Å.

An interlevel insulator 23 is provided on the thermal oxide film 19 and above the trench 16. The interlevel insulator 23 is composed of $SiO_2$, BPSG, or PSG. When the interlevel insulator 23 is provided by $SiO_2$, its thickness is 4,000 Å. The thickness is 8,000 Å in the case of BPSG. The thickness is 2,000 Å in the case of PSG. In addition, a source electrode 24, a gate electrode 25, a field plate electrode 26 and a channel stopper electrode 27 are provided on the source region 14, the gate electrode layer 20, the channel region 13, and the channel stopper 15, respectively. Each of the electrodes 24 to 27 has a thickness of 1,500 Å when it is made of Ti, and each of the electrodes 24 to 27 has a thickness of 4.0 μm when it is they are made of Al. A final passivation film 28 of a plasma SiN is provided on the substrate surface to a thickness of 1.5 μm.

In the structure described above, a relationship between a depth of the trench and an on-resistance and a relationship between the on-resistance and an impurity carrier concentration of the epitaxial layer will be described below.

Figure 2:
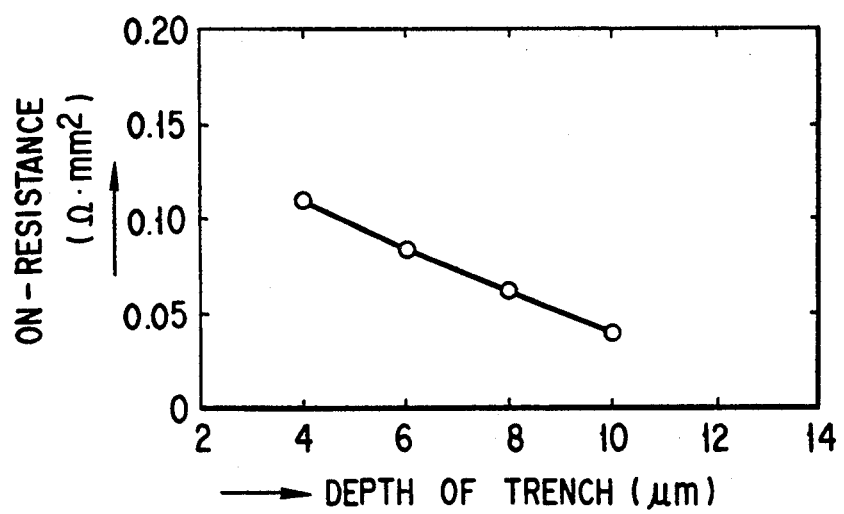
FIG. 2 is a graph showing a relationship between an on-resistance and a depth of a trench in FIG. 1.
Figure 3:
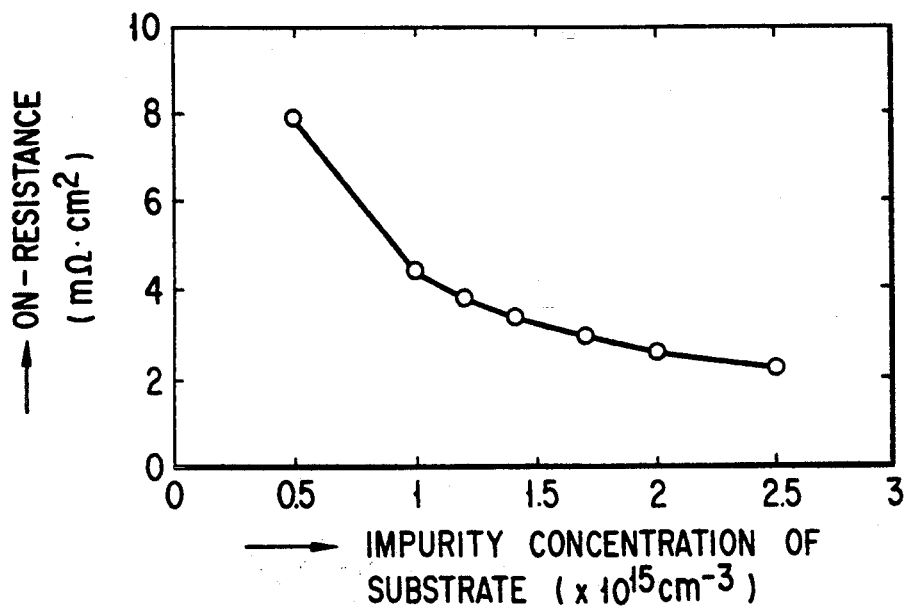
FIG. 3 is a graph showing a relationship between the on-resistance and an impurity concentration of a substrate in FIG. 1.
Figure 4:
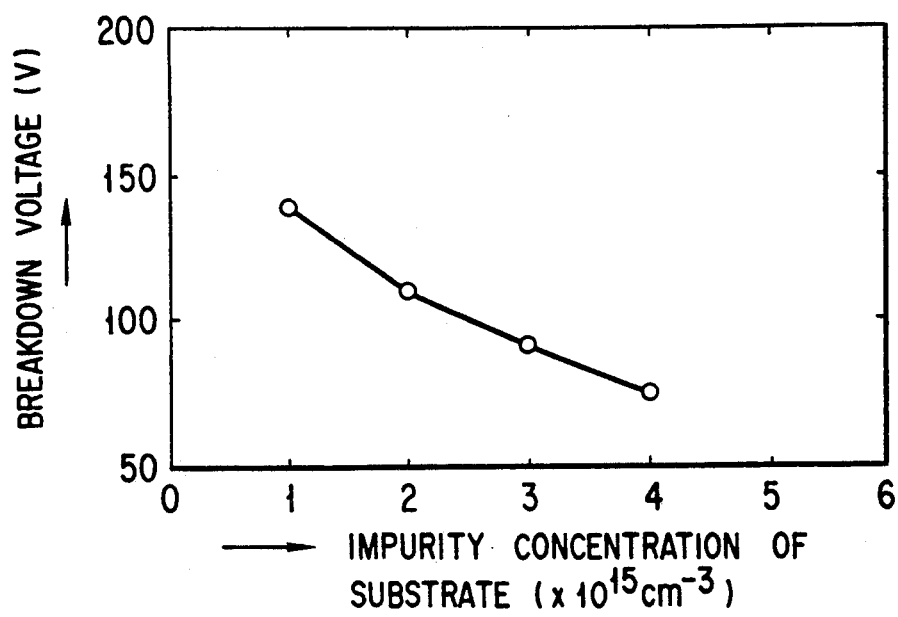
FIG. 4 is a graph showing a relationship between a breakdown voltage and the impurity concentration of the substrate in FIG. 1.

As shown in FIG. 2, the on-resistance is decreased as the bottom of the trench is closer to the substrate. As shown in FIG. 3, as the impurity carrier concentration of the epitaxial layer is increased, the on-resistance is decreased. However, when the depth of the trench is increased to cause the bottom of the trench to be closer to the substrate, a breakdown voltage is decreased. Furthermore, as the impurity carrier concentration of the epitaxial layer is increased, as shown in FIG. 4, the breakdown voltage is decreased. In the latter case, the decrease in breakdown voltage must be determined by considering the trade-off between the breakdown voltage and the on-resistance. In the former case, the decrease in breakdown voltage can be prevented by lowering an electric field concentration at the bottom of the trench.

Figure 5:
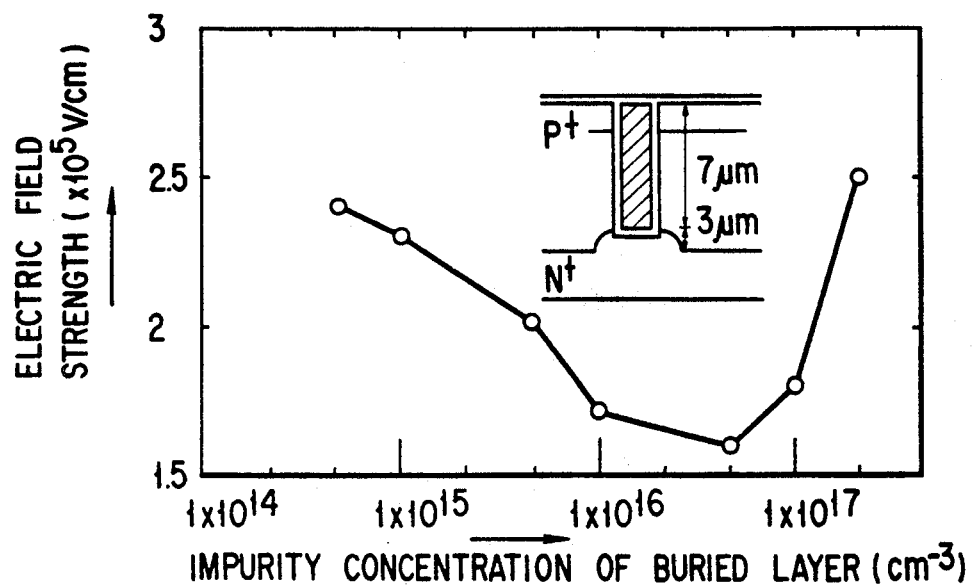
FIG. 5 is a graph showing a relationship between an electric field strength and an impurity concentration of a buried layer in FIG. 1.

In the present invention, the buried layer 17 is provided between the bottom of the trench 16 and the substrate 11 to lower the electric field concentration. That is, as shown in FIG. 5, when the depth of the trench 16 is set to be 7 μm, the electric field strength can be reduced to $2 \times 10^5$ V/cm in the buried layer 17 having the impurity concentration of $1 \times 10^{15}$ cm$^{-3}$ to $1 \times 10^{17}$ cm$^{-3}$.

According to the structure, the depth of the trench 16 in which the gate electrode layer 20 is provided is increased to 7 μm, so to be close to the substrate 11. Therefore, the on-resistance can be decreased without increasing the area of the device.

In addition, the buried layer 17 is provided between the bottom of the trench 16 and the substrate 11, and the impurity concentration of the buried layer 17 is set to be lower than that of the substrate 11 and higher than that of the epitaxial layer 12. For this reason, the electric field concentration at the bottom of the trench 16 can be reduced to increase the breakdown voltage.

Another embodiment of the present invention will be described below. The same reference numerals as in the first embodiment denote the same parts in the second embodiment, and the detailed description thereof will be omitted.

Figure 6:
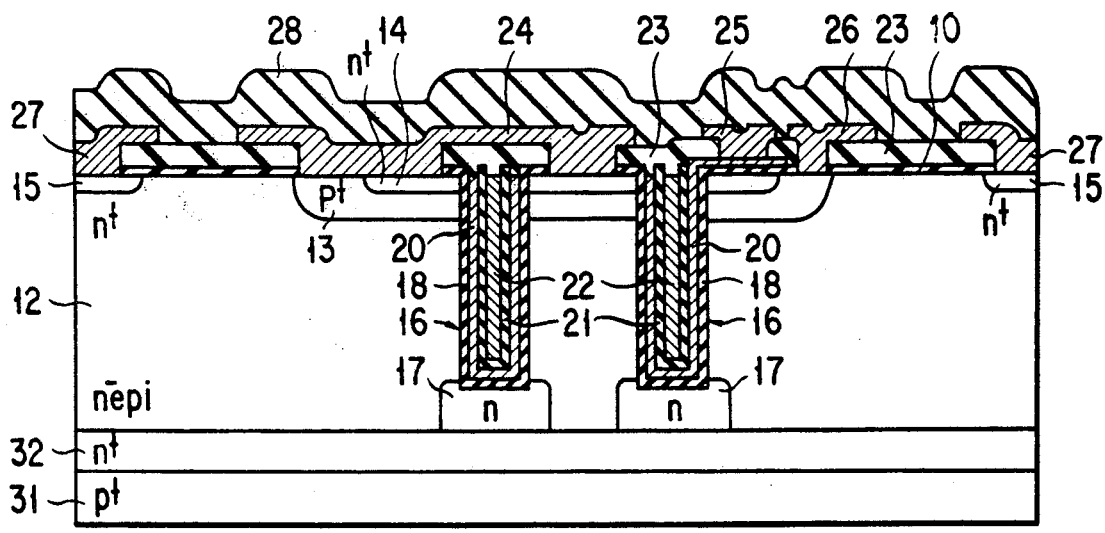
FIG. 6 is a side sectional view showing an IGBT according to a second embodiment of the present invention.

FIG. 6 shows the second embodiment in which the present invention is applied to an IGBT (Insulated Gate Bipolar Transistor).

In FIG. 6, an n$^+$-type semiconductor layer 32 is provided on a p$^+$-type silicon substrate 31 serving as a collector. The n$^-$-type epitaxial layer 12 is provided on the semiconductor layer 32, and the trench 16, the buried layer 17 and the like are formed in the epitaxial layer 12.

According to the structure, an IGBT having a low on-resistance and a high breakdown voltage can be obtained.

Figure 7:
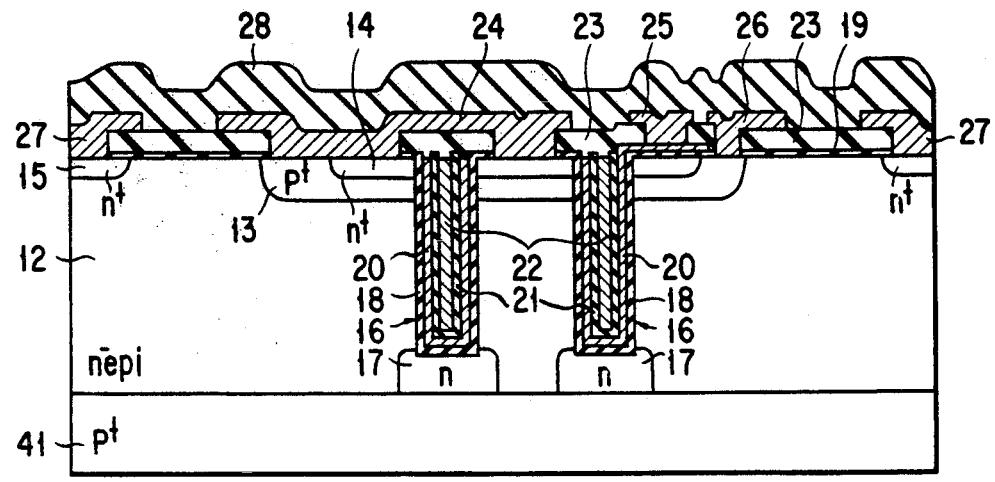
FIG. 7 is a side sectional view showing an IGBT according to a third embodiment of the present invention.

FIG. 7 shows the third embodiment of the present invention obtained by modifying the embodiment in FIG. 6.

In FIG. 6, the n$^+$-type semiconductor layer 32 is formed on the p$^+$-type silicon substrate 31. In this embodiment, however, the n$^-$-type epitaxial layer 12 is provided on a p$^+$-type silicon substrate 41, and the trench 16, the buried layer 17, and the like are formed in the epitaxial layer 12. According to the structure, the same advantages as described in the second embodiment can be obtained.

Figure 8:
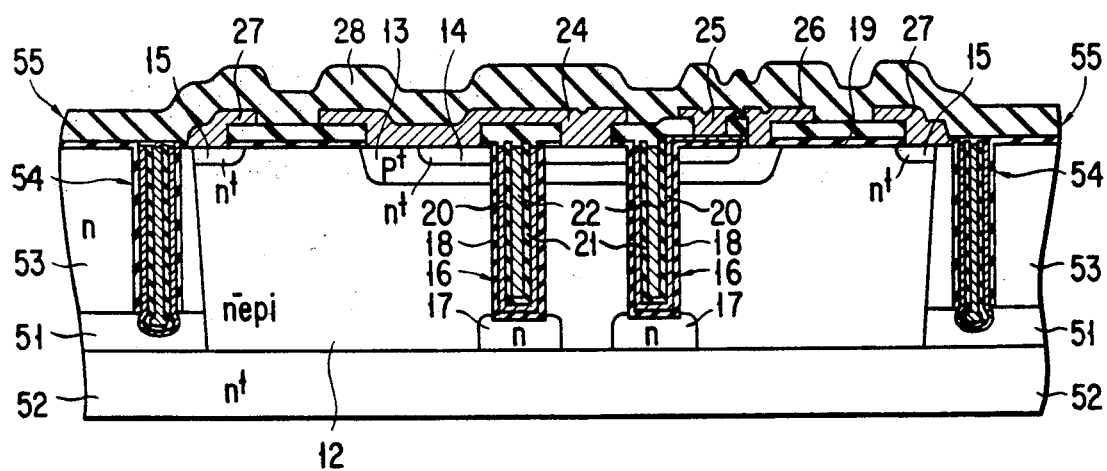
FIG. 8 is a side sectional view showing an IPD according to a fourth embodiment of the present invention.

FIG. 8 shows the fourth embodiment of the present invention. The same reference numerals as in the first embodiment denote the same parts in the fourth embodiment, and the detailed description thereof will be omitted.

The embodiment shows an IPD (Intelligent Power Device) in which a power MOSFET and a small signal circuit including a C-MOS transistor or a bipolar transistor are provided in the same chip.

In this case, an n$^+$-type substrate 52 and an n-type substrate 53 which are bonded to each other by a silicon oxide layer 51 are used. The epitaxial layer 12 is provided in the n-type substrate 53 in which the power MOSFET having the gate electrode formed in the trench of the epitaxial layer 12 is provided. In addition, an insulating region 54 connected to the silicon oxide film 51 is provided in the n-type substrate 53. The insulating region 54 is formed in the same step as that of forming the gate electrode layer in the trench. The n-type substrate 53 insulated by the insulating region 54 serves as a small signal circuit region 55, and a small signal circuit including a C-MOS transistor or a bipolar transistor is arranged in the small signal circuit region 55.

According to the structure, since the insulating region 54 can be formed in the same step as that of forming the power MOSFET having the gate electrode layer provided in the trench, the number of manufacturing steps can be reduced.

As described above, according to the present invention, the bottom of the trench in which the gate is provided is located close to the substrate, and the buried layer is provided between the bottom of the trench and the substrate. Therefore, the on-resistance can be decreased by increasing the depth of the trench.

In addition, since the impurity carrier concentration of the buried layer is set to be lower than the impurity carrier concentration of the semiconductor substrate and higher than the impurity carrier concentration of the epitaxial layer, the breakdown voltage can be increased sufficiently.

It is further understood by those skilled in the art that the foregoing description is only of the preferred embodiments and that various changes and modifications may be made in the invention without departing from the spirit and scope thereof.

What is claimed is:

1. A power MOS semiconductor device, comprising:
   a body of semiconductor material including a first semiconductor layer of a first conductivity type and a substrate having an impurity concentration, said first semiconductor layer having an impurity concentration lower than said impurity concentration of said substrate;
   a second semiconductive layer of a second conductivity type having a high impurity concentration and disposed in said first semiconductor layer to provide a channel;
   a third semiconductive layer of said first conductivity type having a high impurity concentration and disposed in said second semiconductor layer;
   a trench disposed in said first semiconductor layer across said second and third semiconductor layers, said trench having a bottom and a depth deep enough to reduce an electric field concentration at said bottom of said trench;
   a buried layer of said first conductivity type disclosed in said first semiconductor layer, said buried layer contacting said substrate and being located between said bottom and said trench and said substrate, said buried layer having an impurity concentration approximately in the range of $5 \times 10^{15}$ cm$^{-3}$ to $1 \times 10^{17}$ cm$^{-3}$;
   a gate insulating film covering a surface of said trench and extending to a surface of said third semiconductor layer; and
   a gate electrode layer provided on said gate insulating film.

2. The power MOS semiconductor device according to claim 1, wherein said bottom of said trench is located close enough to said substrate to minimize an on-resistance of the semiconductor device.

3. The power MOS semiconductor device according to claim 1, wherein said substrate has a high impurity concentration of said first conductivity type and provides a vertical power MOSFET.

4. The power MOS semiconductor device according to claim 1, wherein said substrate has a high impurity concentration of said second conductivity type and the power MOS semiconductor device further comprises a fourth semiconductor layer having a high impurity concentration of said first conductivity type to provide an insulated gate bipolar transistor.

5. The power MOS semiconductor device according to claim 4, wherein said buried layer is provided between said bottom of said trench and said fourth semiconductor layer, said buried layer contacting said fourth semiconductor layer.

6. The power MOS semiconductor device according to claim 1, wherein said substrate has a high impurity concentration of said second conductivity type to provide an insulated gate bipolar transistor.

7. The power MOS semiconductor device according to claim 1, wherein said depth of said trench controls an on-resistance of said semiconductor device.

8. The power MOS semiconductor device according to claim 1, wherein said buried layer reduces an electric field at said bottom of said trench.

9. The power MOS semiconductor device according to claim 1, wherein said substrate of said first conductivity type provides a plurality of small signal circuit regions isolated from one another.

10. The power MOS semiconductor device according to claim 9, wherein each of said plurality of small signal circuit regions includes a MOSFET.

11. The power MOS semiconductor device according to claim 9, wherein each of said plurality of small signal circuit regions includes a bipolar transistor.

* * * * *